United States Patent [19]
Lin et al.

[11] Patent Number: 5,878,911
[45] Date of Patent: Mar. 9, 1999

[54] SOLDER-BALL SUPPLYING APPARATUS

[75] Inventors: Ching-Lin Lin, Hsinchu; Meng-Chun Chen, Tainan; Chen-Chung Du, Hsinchu; Jing-Ching Lin, Hsinchu; Chyi-Liou Lin, Hsinchu, all of Taiwan

[73] Assignee: Industrial Technology Research Institute, Hsinchu, Taiwan

[21] Appl. No.: 881,900

[22] Filed: Jun. 23, 1997

[51] Int. Cl.$^6$ ................................................. B65G 59/00
[52] U.S. Cl. ........................................... 221/278; 221/13
[58] Field of Search .................................. 221/278, 281, 221/258, 9, 13, 17, 92, 211, 277, 135

[56] References Cited

U.S. PATENT DOCUMENTS 5,624,054  4/1997  Baws ........................................ 221/278

Primary Examiner—Kenneth Noland
Attorney, Agent, or Firm—W. Wayne Liauh

[57] ABSTRACT

A solder-ball supplying apparatus for a ball-grid array (BGA) IC packaging process is provided, which can supply solder balls of diameters from 0.5 mm to 1.0 mm at a preset amount to a solder-ball implanting machine. The solder-ball supplying apparatus is fully automated, in which vacuum means is used to suck out a preset amount of solder balls from a storage tank that are to be supplied. Rotary pneumatic cylinder means in conjunction with valve means are used to control the conveyance of the solder balls to the container. This solder-ball supplying apparatus can supply solder balls fast and in a non-contact manner that can prevent damage to the solder balls being supplied. It is fully automated so that manual labor is reduced and the quality of the solder balls being supplied can be assured.

17 Claims, 3 Drawing Sheets

SOLDER-BALL SUPPLYING APPARATUS

BACKGROUND OF THE INVENTION

1. Field of the Invention

This invention relates to integrated circuit packaging technologies, and more particularly, to a solder-ball supply apparatus used in ball-grid array (BGA) IC packaging processes for supplying solder balls for bonding of wires on the IC packages.

2. Description of Related Art

In conventional BGA IC packaging processes, the solder balls that are used for bonding of wires on the IC packages are supplied manually by human labors or in a semi-automatic way. One drawback to the semi-automatic way of supplying the solder balls, however, is that it will not allow the overall packaging process to be carried out in an integral manner. A conventional solder-ball supplying apparatus is disclosed in Republic of China Patent Publication No. 261,558, by which the solder balls are supplied in an array through a feeder. This patent, however, is not able to supply the solder balls in an automatic manner.

There exists, therefore, a need for a new solder-ball supplying apparatus which can supply solder for the bonding of wires on IC packages in preset volumes fast in an automatic manner, and which will not cause damage to the solder balls during the supplying process.

SUMMARY OF THE INVENTION

It is therefore a primary objective of the present invention to provide a solder-ball supplying apparatus which can supply solder balls in IC packaging processes in preset volumes in an automatic manner.

It is another objective of the present invention to provide a solder-ball supplying apparatus which can supply solder balls in a non-contact manner so that the solder balls will not be damaged during the supplying process.

It is still another objective of the present invention to provide a solder-ball supplying apparatus which includes a nitrogen container for preventing the solder balls from oxidation due to exposure to the atmosphere.

It is yet another objective of the present invention to provide a solder-ball supplying apparatus which can be adjusted in the supplying quantity of the solder balls and supply solder balls in a fast automatic manner so that human labor can be saved.

In accordance with the foregoing and other objectives of the present invention, a new solder-ball supplying apparatus is provided. The solder-ball supplying apparatus includes a storage tank of solder balls; means for supplying nitrogen gas to the solder-ball storage tank to prevent the solder balls therein from oxidation due to exposure to the atmosphere; vacuum means for sucking solder balls from the solder-ball storage tank; filtering means for being a buffer of the solder balls picked up from the storage tank by the vacuum means; intermediate storage means for receiving solder balls from the filtering means; sensing means, mounted in the intermediate storage means, for stopping the action of the vacuum means when a preset amount of the solder balls is sensed in the intermediate storage means; pipe means, coupled to the intermediate storage means, for conveying the solder balls from the intermediate storage means to a container; driving means, coupled to the pipe means, which is capable of moving the pipe means downwards to a bottom position in the container, and moving the pipe means back to original position after the solder balls are all conveyed onto the container; and valve means, coupled between the pipe means and the intermediate storage means, which is turned open when the solder balls are to be supplied to the container, and closed when the solder balls are all supplied to the container.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
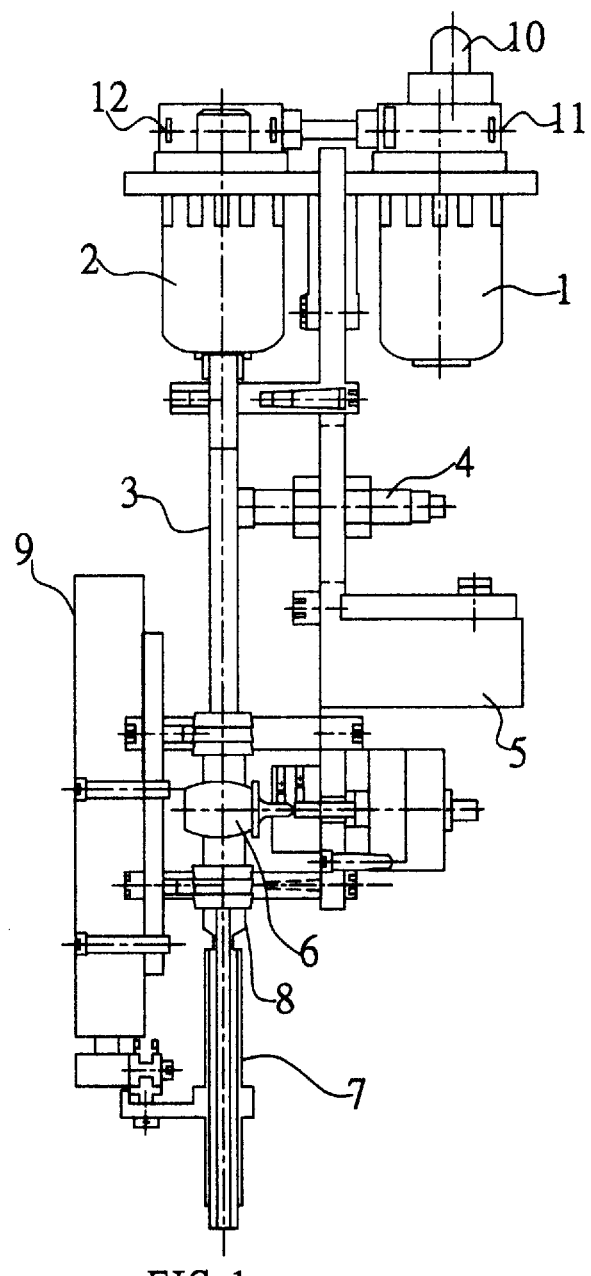
FIG. 1 is a side view of the solder-ball supplying apparatus according to the invention.

FIG. 1 is a side view of the solder-ball supplying apparatus according to the invention. As shown, the solder-ball supplying apparatus of the invention includes a solder-ball storage tank 1, a solder-ball filter 2, an intermediate-storage hose 3, a proximity detector 4, a rotatory pneumatic cylinder 5, a ball valve 6, a movable conveyance pipe 7, a guide pipe 8, a driving pneumatic cylinder 9, a storage tank switch 10, a nitrogen connector 11, and a vacuum connector 12.

Figure 2A:
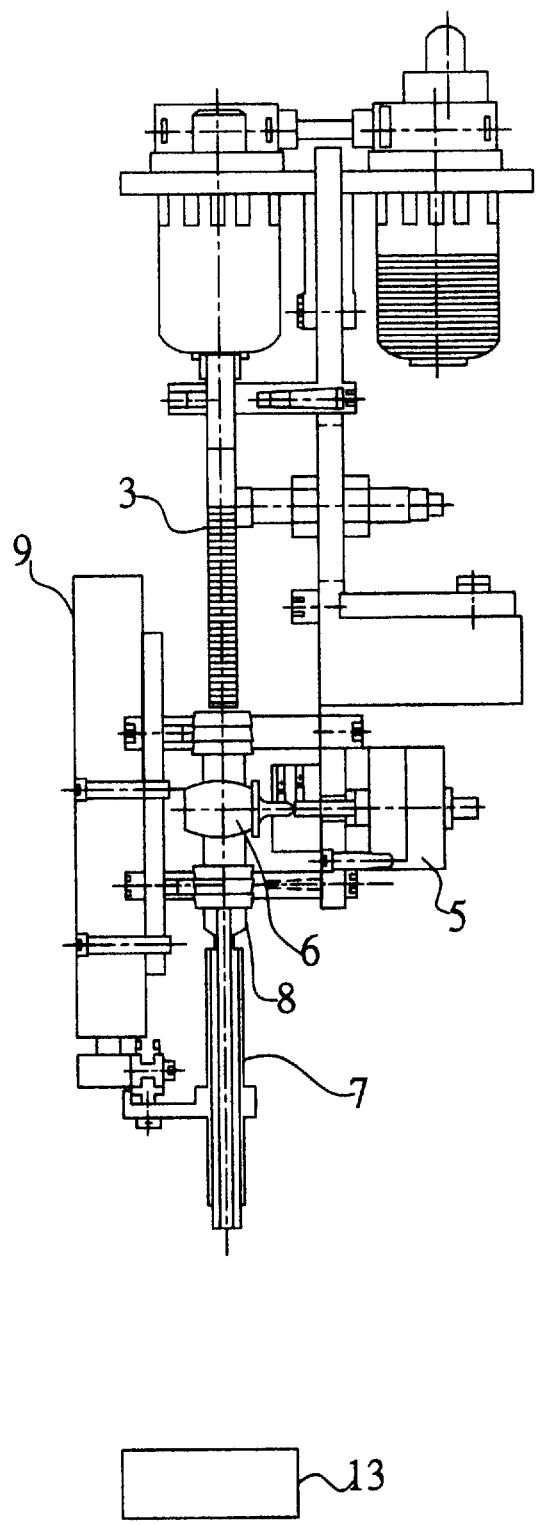
FIG. 2A is a side view of the solder-ball supplying apparatus of FIG. 1 when the solder-ball supplying apparatus is performing a solder-ball pickup process by vacuum means.
Figure 2B:
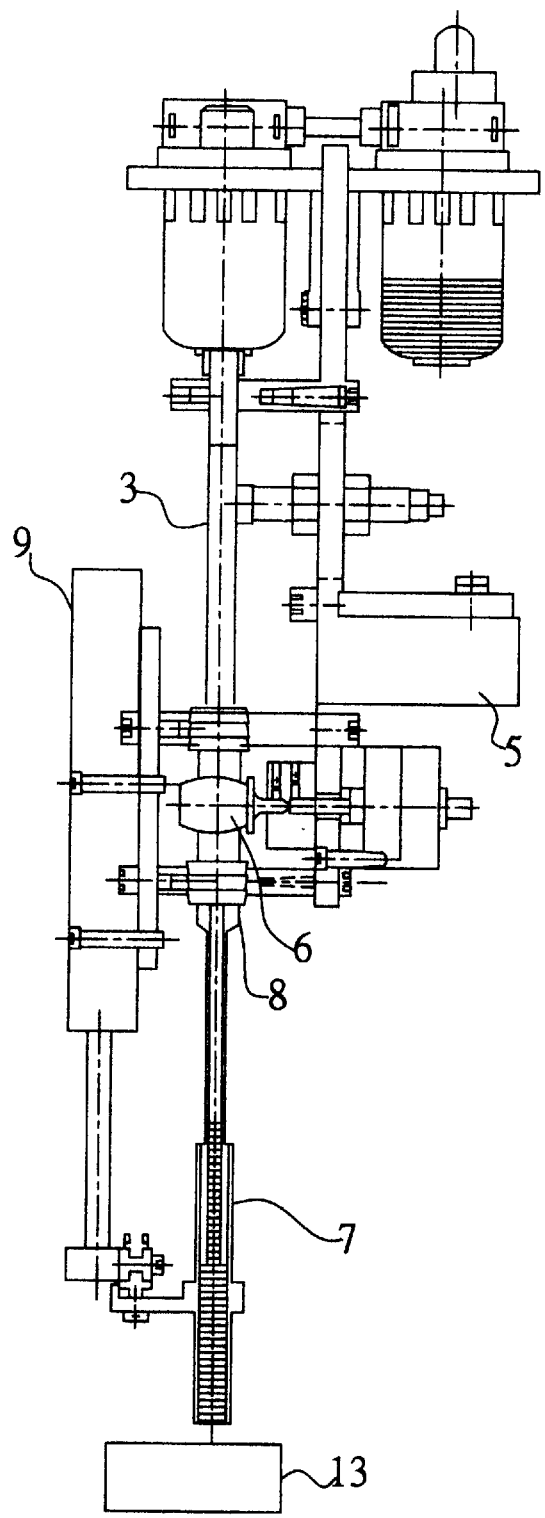
FIG. 2B is a side view of the solder-ball supplying apparatus of FIG. 1 when the solder-ball supplying apparatus is performing a solder-ball supplying process.

When fetching the solder balls through vacuum means, the storage tank switch 10 is turn open, which allows the solder balls to fall into the solder-ball storage tank 1; and at the same time, nitrogen gas is filled through the nitrogen connector 11 into the solder-ball storage tank 1 so as to prevent the solder balls therein from oxidation due to exposure to the atmosphere. In the fetching process, the vacuum connector 12 is connected to the vacuum means (not shown) so as to suck the solder balls in the solder-ball storage tank 1 therethrough to the solder-ball filter 2. These solder balls will fall through the solder-ball filter 2 into the intermediate-storage hose 3 until the amount of solder balls in the intermediate-storage hose 3 is accumulated to a level preset by the proximity detector 4. When the proximity detector 4 is triggered, the sucking action will be stopped. The preset level of the proximity detector 4 can be varied according to actual requirements so as to fill the solder balls in the intermediate-storage hose 3 to a desired quantity. The detail sucking action by the solder-ball supplying apparatus is described in the following with reference to FIG. 2A and FIG. 2B.

In the supplying process, the driving pneumatic cylinder 9 is actuated to move the movable conveyance pipe 7 downwards to a bottom position where the solder-ball container 13 is mounted. The displacement of the movable conveyance pipe 7 to the bottom position can prevent the solder balls from falling to the outside of the solder-ball container 13, thus allowing the solder balls to fall precisely into the solder-ball container 13. When the movable conveyance pipe 7 is in position, the rotatory pneumatic cylinder 5 will be rotated to thereby open the plastic-made ball valve 6. This plastic-made ball valve 6 will not cause damage to the solder balls when they pass therethrough and has good sealing effect. When the ball valve 6 is open, the solder balls in the intermediate-storage hose 3 will fall through the ball valve 6, then the guide pipe 8 and movable conveyance pipe 7, and into the solder-ball container 13. When the solder balls in the intermediate-storage hose 3 is emptied, the rotatory pneumatic cylinder 5 is stopped. After this, the driving pneumatic cylinder 9 is stopped, and the movable conveyance pipe 7 is lifted upwards to the original position. The solder balls, which were originally stored in the intermediate-storage hose 3, are now supplied to and contained in the solder-ball container 13.

From the foregoing description, it can be learned that the solder-ball supplying apparatus of the invention has the following features. First, the non-contact vacuum fetching process allows the solder balls to be sucked into the solder-ball filter where the solder balls are filtered into the intermediate-storage hose. Second, the provision of the proximity detector allows the solder balls to be supplied at a preset amount. Third, the driving pneumatic cylinder in conjunction with the movable conveyance pipe allow the prevention of the solder balls from falling to the outside of the solder-ball container during the conveyance of the solder balls from the intermediate-storage hose to the solder-ball container. Fourth, the provision of plastic-made ball valve will not cause damage to the solder balls passing therethrough when the valve is turned on and off.

In conclusion, the solder-ball supplying apparatus of the invention has several advantages over the prior art. First the invention allows the solder-ball supplying apparatus to supply solder balls in an automatic manner so that the preceding and subsequent processes can be automatic integrated into the overall packaging process. Manual works are thus significantly reduced. Second, the non-contact vacuum fetching process can prevent damage to the solder balls. Third, the module design allows the solder-ball supplying apparatus to be made compact with easy replacement parts. Fourth, the plastic-made ball valve will not cause damage to the solder balls passing therethrough, and has good sealing effect so that nitrogen can be filled therein to prevent oxidation to the solder balls. Further, the plastic body of the ball valve will not subject to chemical reaction with solder. Fifth, the provision of the movable conveyance pipe allows the outlet of the solder balls to be directed into the solder-ball container so that the solder balls will not fall to the outside of the solder-ball container. Sixth, the provision of the solder-ball filter can offer a buffer to the solder balls before falling into the intermediate-storage hose, so that the solder balls will less likely to be damaged due to free falling. Seventh, the solder balls being supplied at one pass can be preset to a desired amount in accordance with actual needs.

The foregoing preferred embodiment of the invention is directed to a solder-ball supplying apparatus that is used specifically to supply solder balls in an IC packaging process. However, the invention is not limited to such an application. It can be used to supply materials in the form of fragile, small pellets, or the like.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A solder-ball supplying apparatus for supplying solder balls to a container, comprising:

a storage tank of solder balls;

vacuum means for sucking solder balls from said solder-ball storage tank;

intermediate storage means for receiving solder balls sucked by said vacuum means;

sensing means, mounted in said intermediate storage means, for stopping the action of said vacuum means when a preset amount of the solder balls is sensed in said intermediate storage means; and pipe means, coupled to said intermediate storage means, for conveying the solder balls from said intermediate storage means to the container.

2. The solder-ball supplying apparatus of claim 1, further comprising:

driving means, coupled to said pipe means, which is capable of moving said pipe means downwards to a bottom position in the container, and moving said pipe means back to original position after the solder balls are all conveyed onto the container.

3. The solder-ball supplying apparatus of claim 2, wherein said pipe means includes:

a movable conveyance pipe for conveying the solder balls into the container; and a guide pipe for guiding said movable conveyance pipe to move thereon.

4. The solder-ball supplying apparatus of claim 3, further comprising:

valve means, coupled between said pipe means and said intermediate storage means, which is turned open when the solder balls are to be supplied to the container, and closed when the solder balls are all supplied to the container.

5. The solder-ball supplying apparatus of claim 1, further comprising:

means for supplying nitrogen gas to the solder-ball storage tank to prevent the solder balls therein from oxidation.

6. The solder-ball supplying apparatus of claim 3, further comprising:

means for supplying nitrogen gas to the solder-ball storage tank to prevent the solder balls therein from oxidation.

7. The solder-ball supplying apparatus of claim 4, further comprising:

means for supplying nitrogen gas to the solder-ball storage tank to prevent the solder balls therein from oxidation.

8. The solder-ball supplying apparatus of claim 1, further comprising:

filtering means, coupled between said solder-ball storage tank and said intermediate storage means, which acts as a buffer to the solder balls picked up from said storage tank by said vacuum means.

9. The solder-ball supplying apparatus of claim 3, further comprising:

filtering means, coupled between said solder-ball storage tank and said intermediate storage means, which acts as a buffer to the solder balls picked up from said storage tank by said vacuum means.

10. The solder-ball supplying apparatus of claim 4, further comprising:

filtering means, coupled between said solder-ball storage tank and said intermediate storage means, which acts as a buffer to the solder balls picked up from said storage tank by said vacuum means.

11. The solder-ball supplying apparatus of claim 1, wherein said intermediate storage means is a hose.

12. The solder-ball supplying apparatus of claim 3, wherein said intermediate storage means is a hose.

13. The solder-ball supplying apparatus of claim 4, wherein said intermediate storage means is a hose.

14. The solder-ball supplying apparatus of claim 11, wherein said sensing means is a proximity detector.

15. The solder-ball supplying apparatus of claim 11, wherein said sensing means is adjustable so as to adjust the amount of solder balls to be supplied to the container.

16. A material supplying apparatus for supplying a material to a container, comprising:

a storage tank of the material;

vacuum means for sucking the material from said material storage tank;

filtering means for being a buffer of the material sucked from said material storage tank;

intermediate storage means for receiving the material from said filtering means;

sensing means, mounted in said intermediate storage means, for stopping the action of said vacuum means when a preset amount of the material is sensed in said intermediate storage means;

pipe means, coupled to said intermediate storage means, for conveying the material from said intermediate storage means to the container;

valve means, coupled between said pipe means and said intermediate storage means, which is turned open when the material is to be conveyed to the container, and closed when the conveyance of the material to the container is completed; and driving means, coupled to said pipe means, for moving said pipe means to the container when the material is to be conveyed to the container and back to original position after the conveyance of the material to the container is completed.

17. The material supplying apparatus of claim 16, further comprising:

means for supplying nitrogen gas to the material storage tank to prevent the material therein from oxidation.

* * * * *